Figure 1:
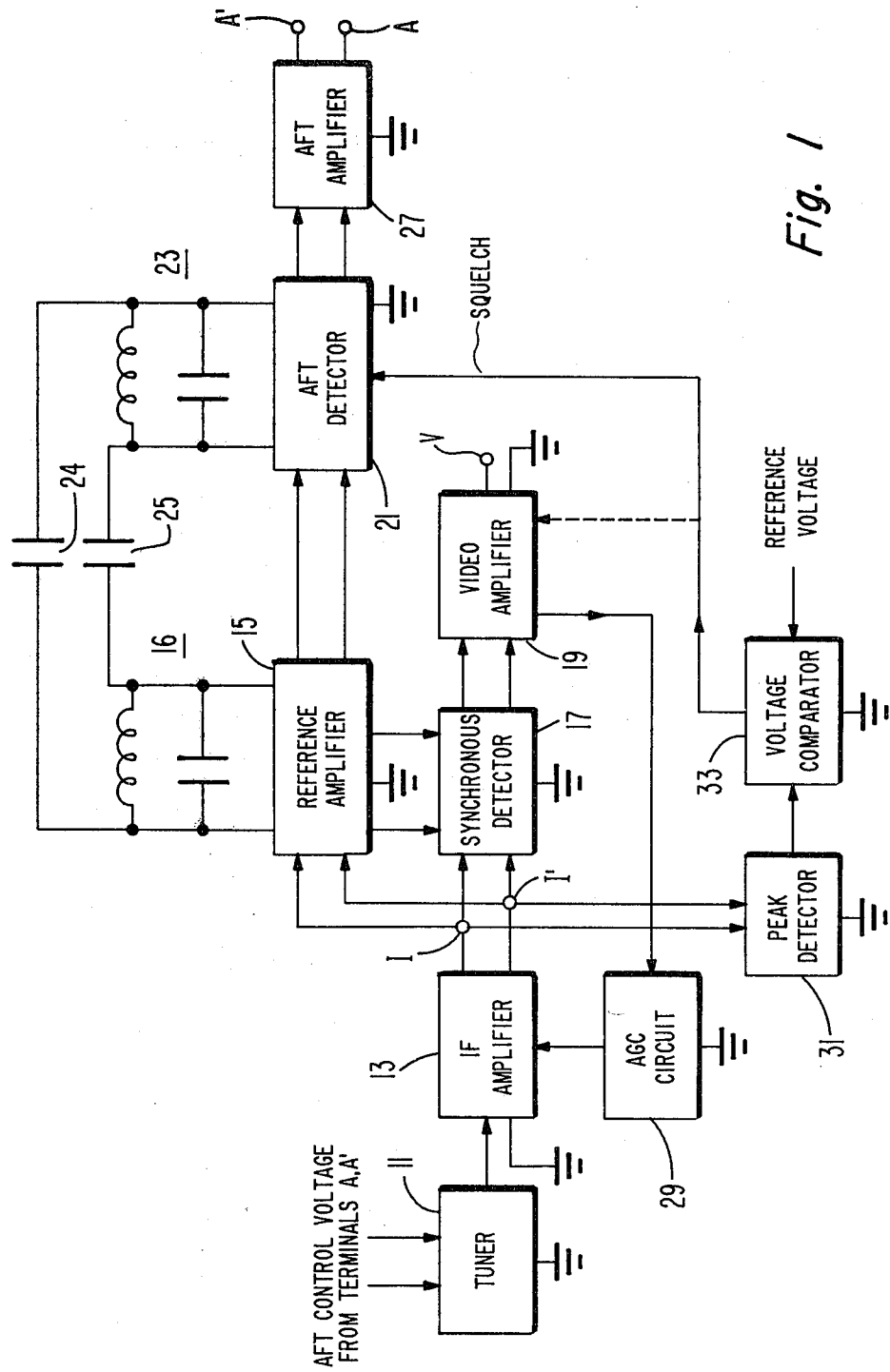

United States Patent [19]

Harford

[11] 4,388,649

[45] Jun. 14, 1983

[54] AFT LOCKOUT PREVENTION SYSTEM

[75] Inventor: Jack R. Harford, Flemington, N.J.

[73] Assignee: RCA Corporation, New York, N.Y.

[21] Appl. No.: 268,914

[22] Filed: Jun. 1, 1981

[51] Int. Cl.³ ............................................. H04N 5/50
[52] U.S. Cl. .............................. 358/195.1; 358/193.1;
455/183; 455/260
[58] Field of Search ............... 358/191.1, 193.1, 195.1;
455/173, 182, 183, 184, 192, 263, 260

[56] References Cited

U.S. PATENT DOCUMENTS

| | | | |
|---|---|---|---|
| 3,715,495 | 2/1973 | Takezaki et al. | 178/5.8 A |
| 3,949,158 | 4/1976 | Rzeszewski | 358/195.1 |
| 4,031,549 | 6/1977 | Rast | 358/195.1 |
| 4,100,578 | 7/1978 | Arneson | 358/195.1 |
| 4,128,849 | 12/1978 | Rhee | 358/167 |
| 4,261,016 | 4/1981 | Hongu | 358/195.1 |
| 4,263,611 | 4/1981 | Gibson | 358/195.1 |
| 4,358,791 | 11/1982 | French | 358/193.1 |

OTHER PUBLICATIONS

TDA 2540 and TDA 2541–New Vision IF ICs, Technical Information 034, Philips Electronic Components and Materials, 11/3/77.

Primary Examiner—Tommy P. Chin
Attorney, Agent, or Firm—Eugene M. Whitacre; Paul J. Rasmussen; William H. Meagher

[57] ABSTRACT

Television receiver employs a synchronous video detector system, and includes an AFT detector responsive to carrier waves supplied by reference amplifier of synchronous detector system. A peak detector, independent of the synchronous video detector and the receiver's automatic gain control system, is responsive to the output of the receiver's IF amplifier, and supplies an output to a voltage comparator. When the comparison indicates the IF output swing exceeds a threshold value, the AFT detector is disabled to avoid an AFT "lockout" condition.

7 Claims, 2 Drawing Figures

AFT LOCKOUT PREVENTION SYSTEM

The present invention relates generally to automatic fine tuning (AFT) systems for television receivers, and particularly to novel arrangements for inhibiting AFT operations under "lockout" conditions that might otherwise result in the AFT system holding the receiver's tuner in a mistuned condition.

In U.S. Pat. No. 4,031,549—Rast, et al., a frequency synthesizer type of tuning system for a television receiver is disclosed which includes special provisions for the tuning of the receiver to accept signals modulated upon RF carriers which are offset from the standard broadcast carrier frequencies. In a Philips Technical Information Brochure No. 034 (1977), entitled "TDA 2540 and TDA 2541—New Vision IF ICs", integrated circuits are described which provide circuitry for implementing television receiver functions of IF amplification, synchronous video detection, automatic gain control, and AFT detection. When a television receiver associates circuitry of the general type described in the aforementioned brochure with a tuner of the general type described in the Rast, et al. patent, certain signal conditions can be encountered during attempts to acquire an offset carrier signal which may result in a "lockout" condition in which the receiver's AFT system holds the receiver's tuner in a mistuned condition.

Under certain off-tuned-conditions, the limiting amplifiers of a synchronous detector system, which are meant to derive from the received signals a reference carrier wave for synchronous switching of the video detector at the picture carrier frequency, can produce beat signals of appreciable magnitude and of a frequency near the center of the narrow response band of the tank circuit that serves as a tuned load for the output limiting amplifier. These beat signals, supplied by the limiting amplifier as inputs to the AFT detector, can produce an AFT detector output that indicates to the tuner that an offset carrier is being acquired. Under the prevailing off-tuned conditions, however, the true picture carrier falls low on the response characteristic of the reference tank circuit. Synchronous switching at the picture carrier frequency does not take place in the video detector, and products of asynchronous detection appearing in the video detector output are falsely interpreted by the AGC system as indicating weak signal reception. The resultant high gain condition for the IF amplifier enhances the beat production, with a possible consequence that the misled AFT system falsely holds the tuner in a mistuned condition.

It has been observed that, under the high gain, mistuned conditions above described, the output of the IF amplifier undergoes much larger swings than is permitted by the AGC system under normal tuning conditions. Pursuant to the principles of the present invention, advantage is taken of this characteristic in development of a system for substantially precluding the maintenance of the above-described "lockout" condition. In accordance with the principles of the present invention, a peak detector, independent of the receiver's synchronous video detector, and automatic gain control system, is rendered responsive to the output of the receiver's IF amplifier. The output of the peak detector is supplied to a voltage comparator which compares the detected peak value with a reference voltage. When the comparison indicates that the IF output swing exceeds a threshold value related to the selected reference voltage, action is taken to squelch the operation of the AFT detector. With the AFT detector disabled, false indications to the tuner of offset carrier acquisition are substantially precluded, permitting the tuner to proceed with programmed revisions of tuning that will permit proper offset carrier acquisition.

In accordance with an illustrative embodiment of the present invention, the IF amplifier, the AFT detector, the IF output peak detector, the peak detector output comparator, and the AFT detector disabler are all realized in integrated circuit form on a common substrate, whereby the lockout problem is subject to solution with on-chip components. Illustratively, where the AFT detector takes the form of a signal multiplier with the array of multiplier transistors supplied with current from a common current source transistor, disabling of the detector is effected by diversion of current away from the common current source transistor.

In accordance with an optional feature of the present invention, disabling of a video amplifier processing the output of the video detector may also be effected when the comparator output indicates that the IF output swing exceeds the threshold value.

Figure 2:
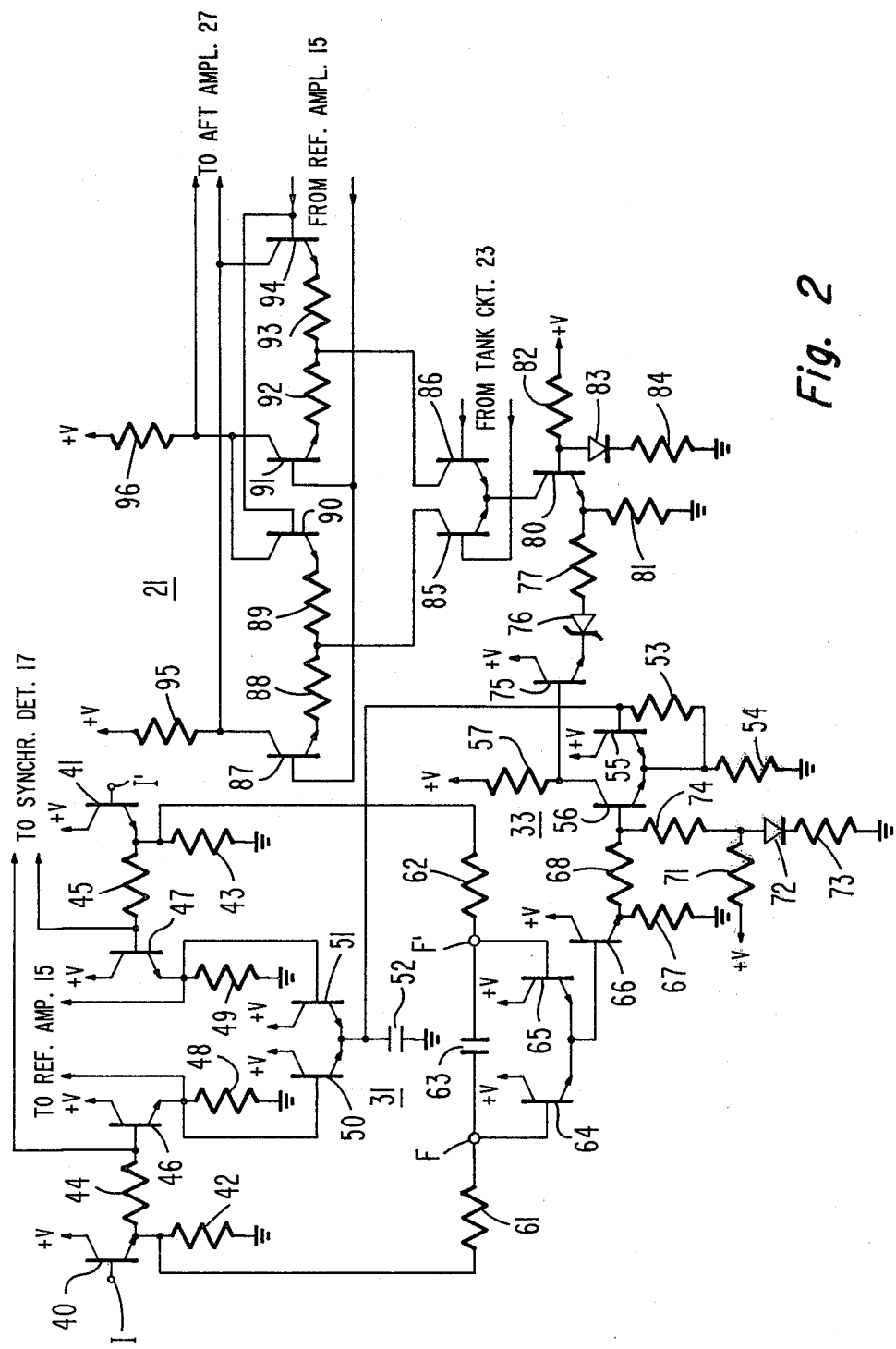

In the accompanying drawing:

FIG. 1 illustrates, partially schematically and partially by block diagram representation, a portion of a television receiver incorporating an AFT lockout prevention system in accordance with an embodiment of the present invention; and FIG. 2 illustrates schematically circuitry which may be advantageously used in implementing several functions of the arrangement of FIG. 1.

In FIG. 1, a television tuner 11, illustratively of the general type described in the aforementioned Rast, et al. patent, develops an IF signal output for delivery to an IF amplifier 13. Aid in fine tuning of the tuner 11 is provided by means of an AFT control voltage supplied to the tuner from AFT output terminals A,A'.

Push-pull versions of amplified IF signals appear at the respective output terminals I,I' of IF amplifier 13, and are delivered therefrom to a synchronous video detector 17, and to a reference amplifier 15. The reference amplifier 15 takes the form of a limiter amplifier having a tuned load, comprising a relatively narrow-band tank circuit 16 tuned to the nominal picture carrier intermediate frequency. Reference amplifier 15 supplies reference carrier waves to the synchronous video detector 17.

During normal operations with proper tuning of tuner 11, composite video signals developed by synchronous detection of the modulated picture carrier waves appear in the output of detector 17, and are subject to amplification in video amplifier 19. Amplified video signals appear at output terminal V of the video amplifier 19 for application to additional video signal processing stages (not shown) of the television receiver. An output of the video amplifier 19 is also applied to an AGC circuit 29, illustratively of the general type described in the aforementioned brochure, for development of a gain control potential for application to IF amplifier 13. During normal operations with proper tuning of tuner 11, the AGC circuit 29 functions to control the gain of IF amplifier 13 in a manner stabilizing the peaks of the deflection synchronizing components of the recovered video signals at a predetermined level.

An AFT detector 21 comprises a signal multiplier which receives, as a first input, reference carrier waves supplied directly from an output of reference amplifier 15, and, as a second input, reference carrier waves from a second tank circuit 23 (also tuned to the nominal picture carrier intermediate frequency) which is coupled by capacitors 24, 25 to the tank circuit 16 of the reference amplifier 15. During normal operations, the AFT detector develops an error voltage output of a magnitude and polarity indicative of departures of the received picture carrier intermediate frequency from the nominal picture carrier intermediate frequency value, and this output is subject to amplification in AFT amplifier 27 and delivery to the aforementioned AFT output terminals A,A'.

Illustratively, the circuitry of synchronous video detector 17, reference amplifier 15 and AFT detector 21 may take the form described in the aforementioned brochure.

For the lockout prevention purposes of the present invention, the arrangement of FIG. 1 additionally includes peak detector 31 and voltage comparator 33. Peak detector 31 is coupled to receive the output of the IF amplifier 13 appearing at terminals I,I', and develops an output potential proportional to the magnitude of swing of the IF output signal. This output potential is applied to voltage comparator 33 for comparison with a reference voltage input thereto. When the peak detector output potential exceeds a threshold value related to the reference voltage, comparator 33 develops an output which is used to squelch the operation of AFT detector 21. Optionally (as indicated by dashed lines in the drawing), the output of comparator 33 is also used to squelch the operation of video amplifier. The latter squelching use may serve to avoid kinescope overload conditions and accompanying supply problems that can be associated with use of the signals otherwise delivered to terminal V during the previously described high gain, off-tuned operations.

Illustratively, the level of the reference voltage input to the comparator 33 is set so that the IF output swing must exceed three times the normal IF output swing maintained by the AGC system before disabling of the AFT detector 21 is effected.

FIG. 2 schematically illustrates circuit arrangements which may be advantageously used to implement the functions of the peak detector 31 and the voltage comparator 33, and associated circuit arrangements suitable for achieving the reference voltage generation and the AFT detector disabling.

In FIG. 2, the push-pull outputs of the IF amplifier appearing at terminals I,I' are coupled, respectively, to the bases of NPN transistors 40, 41 disposed as emitter-followers, with their respective emitter electrodes returned to ground via respective emitter resistors 42,43. The respective emitter electrodes of transistors 40, 41 are connected via respective series resistors (44,45) to the signal inputs of synchronous detector 17 (FIG. 1), and to the bases of NPN transistors 46,47, also disposed as emitter followers, with their respective emitter electrodes returned to ground via respective emitter resistors 48,49.

The IF output signals appearing at the emitter electrodes of transistors 46,47 are applied to the signal inputs of reference amplifier 15 (FIG. 1) and are also applied to the bases of NPN transistors 50,51, disposed as emitter-followers with their emitter electrodes interconnected. Transistors 50,51 cooperate with capacitor 52, coupled between their interconnected emitter electrodes and ground, to form a peak detector (31; FIG. 1) for the IF signal output. A DC return to ground, in shunt with the capacitor 52, is provided via serially connected resistors 53 and 54. The collector electrodes of the emitter-follower transistors 40,41,46,47,50 and 51 are all directly connected to the positive terminal (+V) of an operating potential supply.

A pair of NPN transistors 55,56, disposed with interconnected emitter electrodes returned to ground via the aforementioned resistor 54, form a voltage comparator (33; FIG. 1). The detector output voltage, appearing at the interconnected emitter electrodes of detector transistors 50,51 is directly applied to the base of transistor 55 for comparison with a reference voltage applied to the base of transistor 56.

To fully explain the development of the reference voltage applied to the base of transistor 56, it is necessary to return to a consideration of the IF output signals which appear at the emitters of the input emitter-follower transistors 40,41 superimposed upon respective quiescent DC potentials. In addition to the signal routing previously described, these IF output signals are applied via respective resistors 61,62 to terminals F,F', which are intercoupled by a capacitor 63. The resistors 61,62 cooperate with capacitor to filter out the If signals, whereby the potentials at terminals F,F' are representative of the respective quiescent DC components only. These potentials (in addition to being fed back to the input IF amplifier stage for bias stabilization purposes) are directly applied to the bases of a pair of NPN transistors 64,65, disposed as emitter-followers with their emitter electrodes interconnected. The interconnected emitter electrodes of transistors 64,65 are directly connected to the base of an additional NPN transistor 66, disposed as an emitter-follower with its emitter electrode returned to ground via emitter resistor 67. The collector electrodes of emitter-follower transistors 64,65,66, as well as comparator transistor 55 are directly connected to the +V supply terminal.

The potential at the emitter electrode of transistor 66 substantially matches and tracks with the quiescent DC component contribution to the detector output at the base of comparator transistor 55. A voltage divider formed by serially connecting resistor 71, forward-biased diode 72 and resistor 73 between the +V supply terminal and ground develops an output voltage which is effectively matrixed with the quiescent DC component representative voltage to develop the reference voltage at the base of comparator transistor 56, with the matrixing effected by a network comprising resistor 68 connected between the emitter of transistor 66 and the base of comparator transistor 56, and resistor 74 connected between the divider output terminal and the base of comparator transistor 56. The contribution of the quiescent DC component representative voltage to the reference voltage development substantially lessens the likelihood of disturbance of the desired comparison by spurious variations of the quiescent DC component.

The output of comparator 33 appears across a load resistor 57 connected between the collector electrode of comparator transistor 56 and the +V supply terminal.

The AFT detector (21; FIG. 1) comprises a signal multiplier including a pair of NPN transistors 85,86 disposed in an emitter-coupled amplifier configuration, with the respective bases receiving push-pull input signals from tank circuit 23 (FIG. 1), and with the interconnected emitter electrodes connected to the collector electrode of NPN current source transistor 80. The emitter electrode of transistor 80 is returned to ground via resistor 81. A voltage divider, comprising resistor 82, forward-biased diode 83 and resistor 84 connected in series between the +V supply terminal and ground, develops a bias potential for application to the base of current source transistor 80.

A second emitter-coupled transistor pair is formed by NPN transistors 87,90, with their emitter electrodes interconnected by the series combination of resistors 88 and 89 and driven by the collector of transistor 85 connected to the junction of resistors 88,89. A third emitter-coupled transistor pair is formed by NPN transistors 91,94, with their emitter electrodes interconnected by the series combination of resistors 92 and 93 and driven by the collector of transistor 86 connected to the junction of resistors 92,93. One of the push-pull input signals from reference amplifier 15 is applied in common to the bases of transistors 90 and 94, while the other is applied in common to the bases of transistors 87 and 91.

A first load resistor 95 is connected between the interconnected collector electrodes of transistors 87,94 and the +V supply terminal, and a second load resistor 96 is connected between the interconnected collector electrodes of transistors 90,91 and the +V supply terminals. The detector output signals appearing across the respective load resistors are supplied for amplification to the AFT amplifier 27 (FIG. 1).

For enabling/disabling control of the AFT detector 21, an NPN transistor 75 is disposed as an emitter-follower, with its base electrode directly connected to the collector electrode of comparator transistor 56, with its collector electrode directly connected to the +V supply terminal, and with its emitter electrode connected via the series combination of zener diode 76 and resistor 77 to the emitter electrode of current source transistor 80.

During normal receiver operations with proper tuning of the receiver's tuner, the peak detector output voltage applied at the base of comparator transistor 55 is sufficiently low relative to the reference voltage at the base of comparator transistor 56 as to permit appreciable conduction by transistor 56. Under these conditions, the potential at the collector of transistor 56 is sufficiently low as to ensure that a reverse bias exceeding the breakdown voltage of zener diode 76 does not appear thereacross. No diversion of current from the current source transistor 80 of the AFT detector 21 occurs under these conditions, and the AFT detector 21 is fully enabled.

However, under abnormal conditions described previously, the peak detector output voltage exceeds a threshold value determined by the reference voltage level selection to cause sufficient elevation of the potential at the collector of comparator transistor 56 that breakdown of the zener diode 76 occurs, and the current supplied by resistor 81 is diverted to transistor 75. The signal multiplier transistors 85,86,87,90,91,94 are robbed of operating current, and the AFT detector 21 is disabled under these conditions.

What is claimed is:

1. In a television receiver including a tuner providing an IF output signal representative of a frequency converted version of RF signals selectively amplified thereby; an IF amplifier having an input responsive to said IF output signal of said tuner and having a gain subject to control in accordance with variations of a gain control potential; a synchronous detector responsive to signals amplified by said IF amplifier for recovering video signal information therefrom; an automatic gain control system responsive to an output of said synchronous detector for developing said gain control potential; and an automatic fine tuning system, including an AFT detector responsive to signals derived from an output of said IF amplifier, for providing a tuning control voltage for said tuner; apparatus comprising the combination of:
   a peak detector, responsive to said output of said IF amplifier, and independent of said synchronous detector and said automatic gain control system, for developing an output potential indicative of a peak value attained by signals apearing at said output of said IF amplifier; and
   means, including a voltage comparator responsive to said output potential and to a reference voltage, for disabling said AFT detector when said output potential of said peak detector exceeds a threshold value determined by said reference voltage.

2. Apparatus in accordance with claim 1 wherein said output of said IF amplifier to which said peak detector is responsive comprises intermediate frequency signals superimposed upon a quiescent DC potential; said apparatus also including:
   means for developing said reference voltage; and
   means for rendering said reference voltage developing means responsive to variations, if any, of said quiescent DC potential.

3. Apparatus in accordance with claims 1 or 2 wherein said AFT detector comprises a signal multiplier responsive to first and second versions of said derived signals, one of said versions being subject to a frequency dependent phase shift, and a current source for said signal multiplier; and wherein said detector disabling means includes means for diverting current from said signal multiplier, said current diverting means being responsive to the output of said voltage comparator, and coupled to said current source.

4. Apparatus in accordance with claim 3 wherein said signal multiplier includes first and second switching transistors, having base electrodes driven in push-pull fashion by said one version of said derived signals, and having interconnected emitter electrodes;
   wherein said current source includes a resistor; and a third transistor having a collector electrode connected to said interconnected emitter electrodes, having a base electrode coupled to receive a bias potential, and having an emitter electrode connected to a point of fixed potential via said resistor; and
   wherein said current diverting means includes a fourth transistor disposed as an emitter-follower, and having a base electrode rendered responsive to said output of said voltage comparator and an emitter electrode coupled to the emitter electrode of said third transistor.

5. Apparatus in accordance with claim 4 wherein the coupling of the emitter electrode of said fourth transistor to the emitter electrode of said third transistor is effected by coupling means inclusive of a zener diode, said zener diode exhibiting a blocked state when said output potential of said peak detector lies below said threshold value.

6. Apparatus in accordance with claim 1 wherein said IF amplifier, said peak detector, said AFT detector, and said detector disabling means are realized in integrated circuit form on a common substrate.

7. Apparatus in accordance with claim 1 also including a video amplifier responsive to an output of said synchronous video detector; and means, responsive to an output of said voltage comparator, for disabling said video amplifier when said output potential of said peak detector exceeds said threshold value.

* * * * *